United States Patent
Sung et al.

(10) Patent No.: US 7,789,724 B2
(45) Date of Patent: Sep. 7, 2010

(54) ORGANIC LIGHT EMITTING DIODE DISPLAY CAPABLE OF REALIZING FULL COLOR

(75) Inventors: Un-Cheol Sung, Anyang-si (KR); Joo-Hyeon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 656 days.

(21) Appl. No.: 11/535,589

(22) Filed: Sep. 27, 2006

(65) Prior Publication Data

US 2007/0114922 A1 May 24, 2007

(30) Foreign Application Priority Data

Nov. 18, 2005 (KR) .................... 10-2005-0110712

(51) Int. Cl.
*H01J 9/00* (2006.01)

(52) U.S. Cl. .......................... 445/23; 445/25

(58) Field of Classification Search .......... 445/23–25; 313/504–506
See application file for complete search history.

(56) References Cited

U.S. PATENT DOCUMENTS

| 5,294,869 A * | 3/1994 | Tang et al. .................. 313/504 |
| 6,366,025 B1 | 4/2002 | Yamada |
| 6,392,340 B2 | 5/2002 | Yoneda et al. |
| 6,831,406 B1 | 12/2004 | Fukuyama et al. |

FOREIGN PATENT DOCUMENTS

| JP | 08078163 | 3/1996 |
| JP | 2005-100921 A | 4/2005 |

* cited by examiner

*Primary Examiner*—Joseph L Williams
(74) *Attorney, Agent, or Firm*—Cantor Colburn LLP (57) ABSTRACT

An OLED display for improving white light emitting efficiency and simplifying a manufacturing process includes a plurality of pixels, each of the pixels having a transistor unit, a color filter unit and an organic light emitting device unit. The transistor unit converts signals from the outside into driving signals for driving an organic light emitting device unit. The organic light emitting device unit is composed of blue, red and green emission layers each having different areas. By passing white light through a color filer, the OLED display can realize full color.

12 Claims, 4 Drawing Sheets

ORGANIC LIGHT EMITTING DIODE DISPLAY CAPABLE OF REALIZING FULL COLOR

This application claims priority to Korean Patent Application No. 10-2005-0110712, filed on Nov. 18, 2005, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode ("OLED") display. More particularly, the present invention provides an OLED display and a method of manufacturing the same for improving white light emitting efficiency and simplifying a manufacturing process thereof.

(b) Description of the Related Art

Display devices using a cathode ray tube have been widely used. However, display devices using cathode ray tubes have drawbacks that the volume and weight thereof are large and heavy, respectively, and that they are not easily portable. Recently, in order to overcome the drawbacks of display devices using cathode ray tubes, liquid crystal displays and plasma display devices have been developed and used. Use of liquid crystal displays and plasma display devices have provided rapid progress in space saving and portability.

A liquid crystal display is a non-emissive device that includes a light source for emitting white light and a liquid crystal display unit for controlling the transmittance of the light emitted from the light source. The response speed of a liquid crystal display is only as fast as the time that it takes for a twisted nematic crystal to twist or untwist. Therefore, the liquid crystal display has drawbacks such as high power consumption and slow response speed. A plasma display device also has drawbacks such as high power consumption, driving complexity and low resolution. The inherent drawbacks of the plasma display come from the size of the plasma cells necessary to make an individual pixel and the nature of the injected ionizing gas which must be driven therein. In order to overcome the drawbacks of the liquid crystal display and the plasma display device, much research regarding an organic light emitting diode ("OLED") display has been undertaken. The OLED display is itself a light-emitting device, and it may contain a plurality of light-emitting devices arranged on a substrate in a matrix and an additional substrate for protecting the substrate with the light-emitting devices. The OLED display has characteristics of low power consumption, high response speed, wide viewing angle and high resolution.

The OLED display operates on the principle that organic emission layers, which are placed between an anode providing holes and a cathode providing electrons, generate excitons by hole-electron coupling. The excitons emit light because of the energy released by the coupling (otherwise known as de-excitation). In order to display full color images, the OLED display includes a pixel array for emitting red, green and blue colors. However, the emission efficiency and lifetime of the different organic emission layers used to make red, green and blue pixels differ from each other. Therefore, various remedies have been introduced. In order to solve the described problems of the OLED, U.S. Pat. No. 6,366,025 discloses a technique for forming red, green and blue pixels each having different areas. However, the OLED display having different sized pixels has difficulties in design and driving, such as a low response time.

The OLED display may realize full color by overlapping red, green and blue emission layers having the same areas in one pixel, and disposing a color filter on the emission layers. Such a structure is disclosed in U.S. Pat. No. 6,392,340. In this case, the overlapping emission layers have the same areas and in combination emit white light. The white light is then passed through a color filter to obtain red, green and blue light. In the OLED disclosed in U.S. Pat. No. 6,392,340, the lifetime and characteristics of the emission layers also differ from each other. Also, it has difficulties in that its high luminance white light emitting lifespan is reduced because of a strong interaction between the different emission layers.

BRIEF SUMMARY OF THE INVENTION

Accordingly, one aspect of the present invention is to provide an OLED display and a method for manufacturing the same for minimizing interference between organic emission layers.

An exemplary embodiment of an OLED display according to the present invention includes; an anode which provides holes; a cathode which provides electrons, a plurality of organic emission layers disposed between the anode and the cathode, the plurality of organic emission layers emit light each having different wavelengths through coupling of the holes from the anode and the electrons from the cathode, and a color filter layer which passes the light emitted from the plurality of organic emission layers, wherein the plurality of organic emission layers are sequentially stacked and each have a different surface area.

An exemplary embodiment of the OLED display according to the present invention includes; a gate electrode which provides gate signals, a data electrode which provides data signals, a power source electrode which provides power source signals, a switching transistor and a driving transistor operated in response to signals provided from the gate electrode, the data electrode, and the power source electrode, an anode electrically connected to the driving transistor which provides holes, a cathode disposed opposite the anode which provides electrons, first, second and third emission layers disposed between the anode and the cathode to be overlapped with each other, and a color filter overlapped with the first, second and third emission layers, wherein the first, second and third emission layers each have different emission surface areas.

An exemplary embodiment of a method of manufacturing an organic light emitting diode display includes; providing a substrate including a gate electrode, a data electrode, a power source electrode and a color filter, forming an anode on the substrate, applying a photoresist on the substrate, forming a protrusion around an emission region by exposing and developing the photoresist to expose at least a part of the photoresist around the emission region, forming a first emission layer by applying a first light emitting material at a first angle to a substrate surface, forming a second emission layer on the first emission layer by applying a second light emitting material at a second angle to the substrate surface, wherein the second angle differs from the first angle, and forming a cathode on the first and second emission layers.

An exemplary embodiment of a method of manufacturing an organic light emitting diode display includes; providing a gate electrode, a data electrode, a power source electrode and a color filter on a substrate, forming an anode which provides holes on the substrate, forming a protrusion around an emission region by screen printing, forming a first emission layer by applying a first light emitting material at a first angle to the substrate surface, forming a second emission layer on the first emission layer by applying a second light emitting material at a second angle to the surface of the substrate, wherein the second angle differs from the first angle, and forming a cathode on the first and second emission layers which provides electrons.

DETAILED DESCRIPTION OF THE INVENTION

The present invention now will be described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

An exemplary embodiment of the present invention will hereinafter be described in detail with reference to the accompanying drawings.

Figure 1:
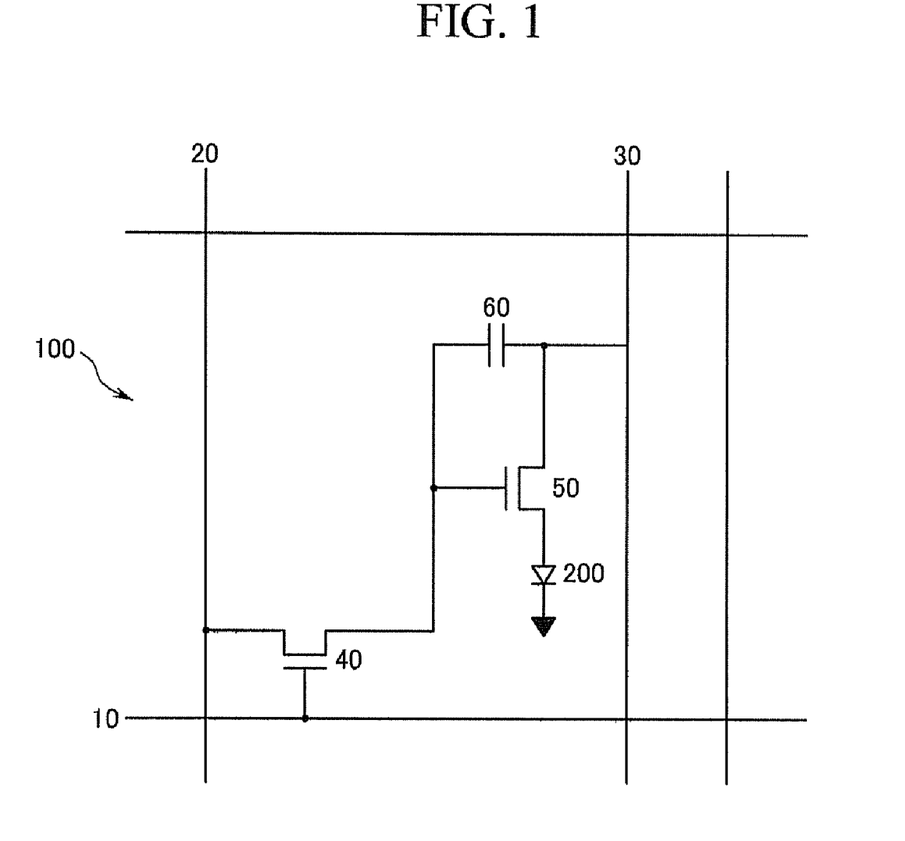
FIG. 1 is an equivalent circuit diagram of an exemplary embodiment of an OLED display according to the present invention.
Figure 2:
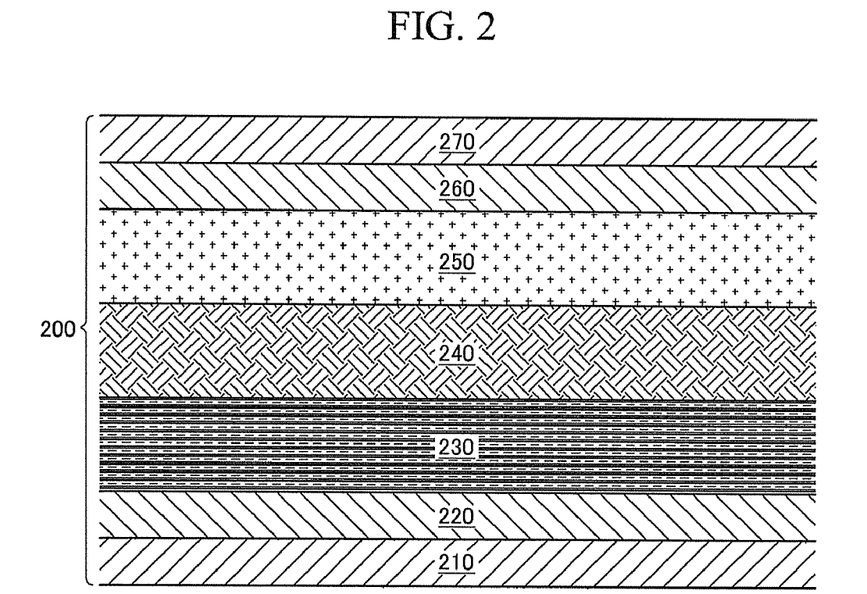
FIGS. 2, 3, 4 and 5 are cross-sectional views showing the areas of differing emission layers in exemplary embodiments of an OLED display according to the present invention.

FIG. 1 is an equivalent circuit diagram of an exemplary embodiment of an OLED display according to an exemplary embodiment of the present invention. The equivalent circuit diagram illustrates one pixel of such a display. FIG. 2 is a cross-sectional view of an exemplary embodiment of an organic light emitting device of the exemplary embodiment of an OLED display according to the present invention.

Referring to FIG. 1, a pixel 100 is connected to a gate signal line 10 for transferring gate signals, a data signal line 20 for transferring data signals and a driving voltage line 30 for transferring driving voltages. An organic light emitting diode ("OLED") display includes a plurality of pixels. In one exemplary embodiment, the pixels may be arranged in a matrix formed in row and column directions. That is, the OLED display has a plurality of gate signal lines 10 extending in a row direction to run parallel to each other, a plurality of data signal lines 20 extending in a column direction to run parallel to each other, and a plurality of driving voltage lines 30.

Each pixel 100 includes a switching transistor 40, a driving transistor 50, a storage capacitor 60, and an organic light emitting diode (OLED) 200. The switching transistor 40 has a gate electrode connected to the gate signal line 10, a source electrode connected to the data signal line 20, and a drain electrode connected to the driving transistor 50 and one side of the storage capacitor 60. The switching transistor 40 transfers a data signal applied to the data signal line to the driving transistor 50 in response to a gate signal applied to the gate signal line 10.

The driving transistor 50 has a gate electrode connected to the drain electrode of the switching transistor 40, a source electrode connected to the driving voltage line 30 and the other side of the storage capacitor 60, and a drain electrode connected to the OLED 200. The driving transistor 50 outputs a current which varies with the voltage between the source electrode and the drain electrode, to the OLED 200.

The storage capacitor 60 is placed between the gate electrode of the driving transistor 50 and the driving voltage line 30, and stores the gate electrode signal of the driving transistor 50 when the switching transistor 40 is turned off.

According to the present exemplary embodiment, the switching and driving transistors 40 and 50 for driving the OLED 200 are n-channel field effect transistors. However, alternative configurations include embodiments in which the switching transistor 40 and/or the driving transistor 50 may be p-channel field effect transistors. Additionally, the connection relationship among the switching transistor 40, the driving transistor 50, the capacitor 60, and the OLED 200 as described in accordance with the present exemplary embodiment may vary.

Referring to FIG. 2, an organic light emitting diode ("OLED") 200 includes an anode 210 connected to the drain electrode of the driving transistor 50, a cathode 270 connected to a common voltage provided from an outside, and organic light emitting members 220 to 260 which are placed between the anode 210 and the cathode 270 and emit light by electron-hole coupling. Since the cathode 270 is provided with the common voltage, the intensity of the light emitted from the organic light emitting members 220 to 260 depends on the drain electrode current of the driving transistor 50.

More specifically, the organic light emitting members 220 to 260 are composed of red, green, and blue organic light emitting material stacked to emit white light in accordance with an additive color model.

As shown FIG. 2, the OLED 200 has the anode 210 connected to the drain electrode of the driving transistor 50, a hole transport layer 220 adjacent to the anode 210, the cathode 270 for providing common electrode signals which are provided from the outside, an electron transport layer 260 adjacent to the cathode 270, and blue, red and green emission layers 230, 240 and 250 for emitting light by coupling holes and electrons received from the hole and electron transport layers 220 and 260 to generate excitons.

Each of the blue, red and green emission layers 230, 240 and 250 contain different light emitting materials, and may have a different light emitting efficiency under the similar electrical conditions. For example, the light emitting efficiency of the green emission layer 250 may be greater than the light emitting efficiency of the red emission layer 240, which in turn may be greater than the light emitting efficiency of the blue emission layer 230.

Each of the emission layers 230, 240 and 250 in the present exemplary embodiment overlap each other and have different surface areas. Because the efficiency of the emission layers 230, 240 and 250 decreases, for example in the order of green, red and blue, the surface area of the emission layers 230, 240 and 250 increases in the order of green, red, and blue. Therefore, the surface area of the green emission layer 250 is the smallest, the surface area of the blue emission layer is the largest, and the surface area of the red emission layer is somewhere in between. The area difference between the emission layers 230, 240 and 250 may be adjusted to compensate for the efficiency difference between each layer. When the efficiency difference between two layers is small, the difference in area between the two layer is correspondingly small; when the efficiency difference between two layers is large, the difference in area between the two layers is correspondingly small.

Figure 3:
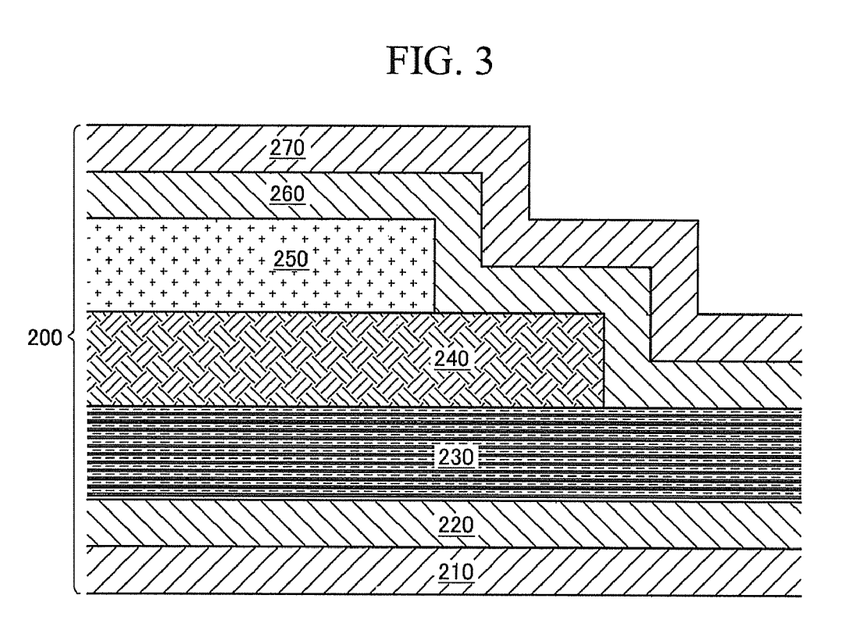
Figure 4:
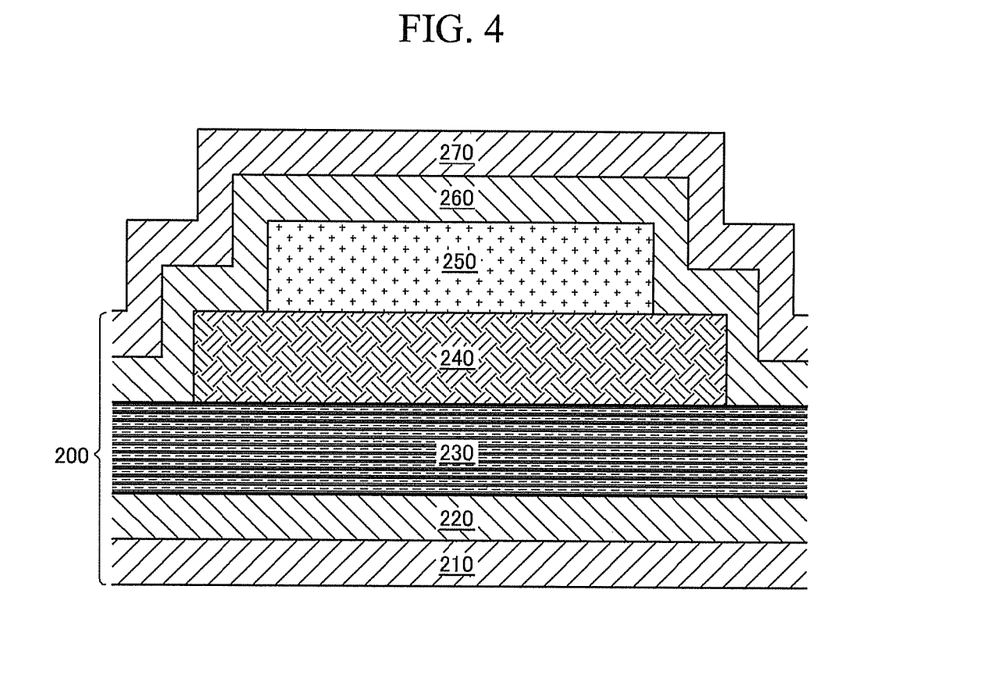

Referring to FIGS. 3 and 4, in another exemplary embodiment of the OLED 200 according to the present invention, the surface areas of emission layers 230, 240 and 250 become smaller as they build toward the top of the OLED. The lowest emission layer 230 is directly bordered by both of the hole and electron transport layers 220 and 260. The light emitting efficiency of the emission layers 230, 240 and 250 increases in an upward direction in each of the FIGS. 3 and 4. Therefore, since the lowest emission layer 230 may have a lower efficiency than upper layers 240 and 250, the area ratio therebetween should be set up with regard to such relationship.

In FIG. 3, one end of each of the emission layers 230, 240 and 250 is aligned with each other. In FIG. 4, a narrower emission layer is placed within the boundary of a wider emission layer, and more particularly, the centers of each of the emission layers 230, 240 and 250 may correspond to each other.

The blue, red, and green emission layers 230, 240 and 250 of the OLEDs illustrated in FIG. 3 and FIG. 4 may be manufactured using conventional techniques. One exemplary embodiment of which is to use shadow masks having different sized openings. That is, as the efficiency of the emission layers 230, 240 and 250 increases in order of blue, red, and green, the shadow mask for the blue emission layer has the largest opening area, and the shadow mask for the green emission layer has the smallest opening area. The resulting pixel has a stack structure of one or more emission layers which are then overlapped with a one color filter.

The anode 210 of the OLED 200 is connected to the drain electrode of the driving transistor 50 is made of transparent conductive material such as indium tin oxide ("ITO") or indium zinc oxide ("IZO"), or a reflective metal such as aluminum (Al) or alloys thereof. The cathode 270 of the OLED 200 receives a common voltage and is made of a reflective metal such as calcium (Ca), barium (Ba), magnesium (Mg), or aluminum (Al), or a transparent conductive material such as ITO or IZO.

Figure 5:
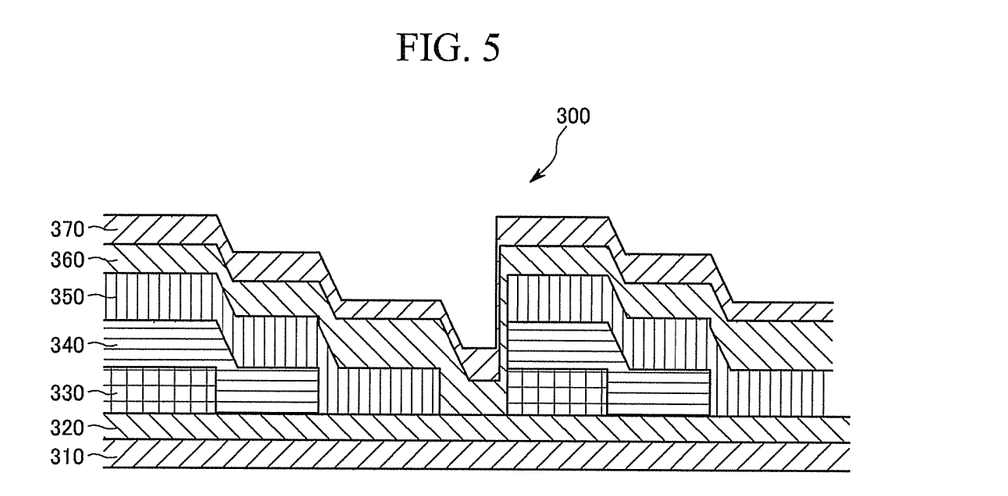

An exemplary embodiment of an OLED 300 illustrated in FIG. 5 has a stack structure of emission layers each having different areas.

Referring to FIG. 5, the OLED 300 has an anode 310 connected to a drain electrode of a driving transistor, a hole transport layer 320 adjacent to the anode 310, a cathode 370 for providing common electrode signals which are provided from the outside, an electron transport layer 360 adjacent to the cathode 370, and green, red and blue emission layers 330, 340 and 350 for emitting light by coupling holes and electrons received from the hole and electron transport layers 320 and 360 to generate excitons.

Each of the blue, red and green emission layers 330, 340 and 350 contain different light emitting materials, and has different light emitting efficiency under similar electrical conditions. For example, the light emitting efficiency of the emission layers 330, 340 and 350 decrease in the order of green, red and blue as described above.

Each of the emission layers 330, 340 and 350 in the present exemplary embodiment overlaps each other and has a different area. As the efficiency of the emission layers 330, 340 and 350 decreases, for example, in the order of green, red and blue, the area of the emission layers 330, 340 and 350 increases in the order of green, red and blue as opposed to the configuration described in the previous exemplary embodiment. The area difference between the emission layers 330, 340 and 350 decreases with a decrease in the efficiency difference therebetween, and increases with an increase in the efficiency difference therebetween, as described above. According to the present exemplary embodiment, the emission layers 330, 340 and 350 in FIG. 5 are stacked in the order of green, red and blue from the anode 310 to the cathode 370.

More specifically, the emission layer 330 having the highest efficiency is stacked first to be placed lowest and contact the hole transport layer 320. For example, if the efficiency of a green emission layer is highest, the green emission layer is applied first. If the efficiency of a red emission layer is next highest, the red emission layer is applied on the green emission layer, and a part of the red emission layer contacts the hole transport layer 320. Then, a blue emission layer having the lowest efficiency is applied, where the lower surface of the blue emission layer contacts the hole transport layer 320 and the upper surface contacts the electron transport layer 360. Since the blue emission layer 350 directly contacts the hole transport layer 320 and the electron transport layer 360, the blue emission layer 350 is placed in the most advantageous condition to generate excitons. As a result, since the efficiency of the blue emission layer is thereby improved through direct contact with both the electron transport layer 360 and the hole transport layer 320, it is preferable for it to have a slightly smaller area ratio than that used when all three emission layers have the same structure.

Figure 6:
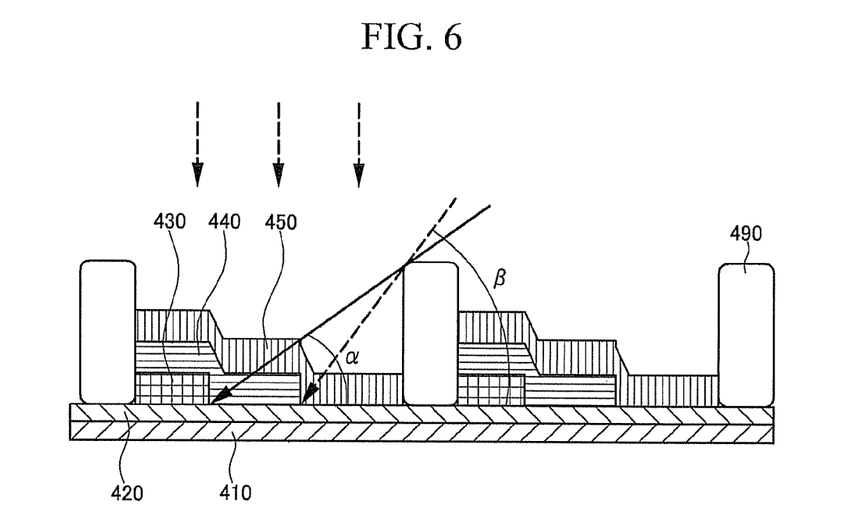
FIG. 6 is a view illustrating an exemplary embodiment of a process of forming emission layers each having different areas in an exemplary embodiment of an OLED display according to the present invention.

FIG. 6 shows an exemplary embodiment of a process of forming the exemplary embodiment of an OLED of FIG. 5.

Deposition regions are formed by making protrusions 490 having a predetermined height on a hole transport layer 420 formed on a substrate 410. Each of the organic emission layers 430, 440 and 450 are formed in the deposition region by depositing them at an angle. The protrusions 490 may be formed by depositing a photoresist on the entire substrate 410 after the formation of the hole transport layer 420 and by exposing and developing the photoresist. The protrusions 490 may also be formed by printing a polymer on the entire substrate 410. The height of the protrusions 490 is higher than the sum of the thickness of the emission layers 430, 440 and 450.

The first emission layer 430 having the highest light emitting efficiency is first deposited at an angle of α on the substrate 410 on which the protrusions 490 are formed, wherein α is in range of about 0 degrees to about 90 degrees with respect to the horizontal surface of the substrate 410. Accordingly, the first emission layer 430 having an area "a" is formed between two adjacent protrusions 490 on the hole transport layer 420. Next, the second emission layer 440 having the second best light emitting efficiency is deposited at an angle of β, wherein β is in range of about 0 degrees to about 90 degrees with respect to the horizontal surface of the substrate 410. Herein, β is larger than α. The second emission layer 440 having an area "b" is formed between two adjacent protrusions 490 while contacting the first emission layer 430 and the hole transport layer 420. Lastly, the third emission layer 450 having the lowest efficiency is deposited in a direction substantially perpendicular to the substrate 410. Accordingly, the third emission layer 450 having an area "c" is formed between two adjacent protrusions 490 while contacting the second emission layer 440 and the hole transport layer 420.

According to one exemplary embodiment, the first, second and third emission layers 430, 440 and 450 are deposited using shadow masks in which only regions corresponding to the emission layers 430, 440 and 450 are open to prevent the light emitting material from being deposited on the other regions. Next, the electron transport layer (not shown) and the cathode (not shown) are sequentially stacked on the upper surface of the third emission layer 450 to complete the OLED.

If the height of the protrusions 490 is too much higher than the entire height of the emission layers 430, 440 and 450, the electron transport layer and the cathode may be over-stretched, thereby causing gaps in either of the layers which leads to short-circuits. Therefore, in one exemplary embodiment the height of the protrusions 490 is set to within twice the cumulative height of the emission layers 430, 440 and 450. In another exemplary embodiment, since the third emission layer 450 is deposited perpendicularly to the substrate 410 the deposition angles for depositing the first and second emission layers 430 and 440 may be maintained within the range of about 45 degrees to about 90 degrees with respect to the horizontal surface of the substrate 410. According to this exemplary embodiment of a method of manufacturing an exemplary embodiment of an OLED display it is possible to form a plurality of emission layer deposition regions in one pixel in order to generate white light to be turned into one color by a color filter.

Figure 7:
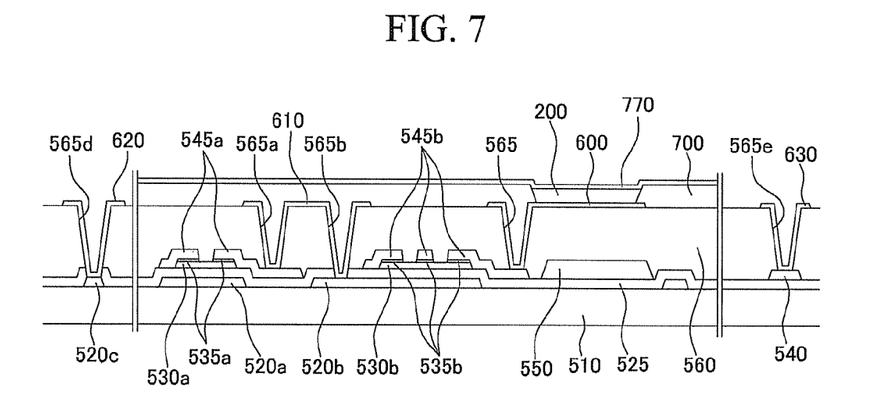
FIG. 7 is a cross-sectional view of one pixel in an exemplary embodiment of an OLED display according to the present invention.

An exemplary embodiment of an OLED display according to the present invention includes a pixel having a cross-section illustrated in FIG. 7. In the exemplary embodiment of a pixel of the exemplary embodiment of an OLED display shown in FIG. 7, first and second gate electrodes 520a and 520b and a gate line (not shown, referring to the gate signal line of FIG. 1) are formed on an insulation substrate 510. In one exemplary embodiment the insulation substrate 510 may be made of a transparent glass or plastic material. The gate line for transferring gate signals is formed in a horizontal direction and includes a pad region 520c having a wide area to receive signals from the outside. The first gate electrode 520a is connected to the gate line and extends upward, and the second gate electrode 520b is formed separately from the gate line. A gate driving circuit (not shown) is directly mounted on the substrate 510 or on another external device to be connected to the gate pad 520c. Alternative exemplary embodiments include the configuration where the gate driving circuit is directly connected to the gate line without necessitating a gate pad region 520c.

In one exemplary embodiment the first gate electrode 520a, the second gate electrode 520b and the gate line may be formed of a single layer made of aluminum, silver, copper, molybdenum, chromium, tantalum, titanium, a metal of the same group thereof, or alloys thereof. Alternative exemplary embodiments include configurations where the gate electrodes and lines comprise a multi-layer structure stacked with different kinds of metals. The multi-layer structure may be made of a combination of ITO and a low resistance material for reducing signal delay or voltage drop, or IZO and a material having physically, chemically, and electrically excellent contact characteristics. The low resistance material may be a metal such as aluminum, silver, or copper, or alloys thereof. Exemplary embodiments of the material with excellent contact characteristics may be molybdenum, chromium, titanium, or tantalum. The first gate electrode 520a, the second gate electrode 520b, and the gate line are formed at an angle of about 30 degrees to about 80 degrees with respect to the substrate 510.

The first gate electrode 520a, the second gate electrode 520b, and the gate line are covered with a gate insulating layer 525. In one exemplary embodiment, the gate insulating layer 525 may be made of silicon nitride ("SiN$_x$") or silicon oxide ("SiO$_x$"). A semiconductor stripe 530a or a semiconductor island 530b is formed on the top of the gate insulating layer 525. In one exemplary embodiment, the semiconductor stripe 530a or semiconductor island 530b may be made from hydrogenated amorphous silicon or polysilicon. The semiconductor stripe 530a extends in a mainly vertical direction to the gate line, and includes a plurality of projections (not shown) extending to the first gate electrode 520a. The semiconductor island 530b is placed on the second gate electrode 520b.

A plurality of first and second ohmic contacts 535a and 535b are formed on the semiconductor stripe 530a and the semiconductor island 530b, respectively. In one exemplary embodiment, the ohmic contacts may be made of a material such as n+ hydrogenated amorphous silicon, which is highly doped with an n-type impurity such as phosphorous (P), or silicide.

A data line (not shown, referring to the data signal line of FIG. 1), a driving voltage line (referring to FIG. 1), and data conductors 545a and 545b are formed on the ohmic contacts 535a and 535b and the gate insulating layer 525. The data conductors 545a and 545b comprise the source and drain electrodes of a switching transistor and source and drain electrodes of a driving transistor.

The data line for transferring data signals extends vertically and intersects with the gate line. The data line (not shown) includes the first source electrode formed in the direction of the gate electrode 520a and a wide pad region 540 to receive signals from the outside. Herein, a data driving circuit (not shown) may be mounted on the substrate 510 or on another external device to be connected to the data pad 540.

The driving voltage line for transferring driving voltages extends vertically and intersects with the gate line. The driving voltage line includes a wide pad region (not shown) to receive signals from the outside. Alternative exemplary embodiments include the configuration where the data driving circuit is directly connected to the data line without necessitating a data pad region 540.

In one exemplary embodiment the data line, driving voltage line, and data conductors 545a and 545b are made of a refractory metal such as molybdenum, chromium, tantalum, and titanium, or alloys thereof. In another exemplary embodiment, the data line, driving voltage line, and data conductors 545a and 545b may have a multi-layer structure including a refractory metal film (not shown) and a low resistance conductive film (not shown). An exemplary embodiment of the multi-layer structure may be a double layer consisting of a lower layer such as chromium or molybdenum (or alloys thereof) and an upper layer such as aluminum (or an alloy thereof), or a triple layer consisting of a lower layer such as molybdenum (or an alloy thereof), a middle layer such as aluminum (or an alloy thereof), and an upper layer such as molybdenum (or an alloy thereof). The data line, the driving voltage line, and the data conductors 545a and 545b are formed so that they have sides which form an angle of about 30 degrees to about 80 degrees with respect to the substrate 510.

The driving transistor includes the data conductors 545b, the second ohmic contacts 535b, the semiconductor island 530b, the gate insulating layer 525, and the second gate electrode 520b. The switching transistor includes the data conductors 545a, the first ohmic contacts 535a, the semiconductor stripe 530a, the gate insulating layer 525, and the first gate electrode 520a.

A color filter layer 550 is formed on the gate insulating layer 525 and is placed under the region on which the OLED will be formed. A color filter layer 550 is formed on each pixel and passes the light output from the OLED therethrough to emit a predetermined color. The color filter layer 550 may be blue, green or red although only one color is applied to each individual pixel. Although the color filter layer 550 is placed under the OLED in the present exemplary embodiment, the color filter layer 550 may be placed on the top of the OLED or anywhere else under the OLED as long as it passes light to emit the predetermined color. The exemplary embodiment described above describes a bottom-type of display where light is emitted to an outside through the bottom of the substrate 510. However, alternative exemplary embodiments of the OLED display also include top-type displays where light is emitted through the top of a common electrode 770 (to be described below) to an outside.

A passivation layer 560 is formed on the data conductors 545a and 545b, the exposed semiconductors 530a and 530b, the gate insulating layer 525, the exposed sides of the first and second ohmic contacts 535a and 535b and the color filter layer 550. The passivation layer 560 is made of an inorganic insulator or an organic insulator and has a flat surface. In one exemplary embodiment the inorganic insulator may be silicon nitride or silicon oxide, it may be photosensitive and it may have a dielectric constant of less than about 4.0. Alternative exemplary embodiments include the configuration where the passivation layer may have a double layer structure consisting of a lower inorganic layer and an upper organic layer in order to protect the insulating characteristic of the organic layer, and the exposed semiconductors 535a and 535b.

The passivation layer 560 has a plurality of contact holes 565a, 565b, 565c, 565d and 565e to expose a part of the second gate electrode 520b, the pad region of the gate line 520c, the pad region of the data line 540, and the data conductors 545a and 545b. A plurality of pixel electrodes 600, a plurality of connecting members 610, and a plurality of contact assistants 620 and 630 are formed on the passivation layer 560. In one exemplary embodiment the pixel electrodes 600, the connecting members 610 and contact assistants 620 and 630 are made of a transparent conductive material such as ITO or IZO, or a reflective metal such as aluminum, silver, or alloys thereof.

The pixel electrode 600 is connected to the drain electrode of the driving transistor through the contact hole 565c. The connecting member 610 connects the drain electrode of the switching transistor and the gate electrode of the driving transistor through the contact holes 565a and 565b.

A barrier 700 is formed on the passivation layer 560 to surround edges of pixel electrode 600 and define a space in which the OLED 200 is formed. The barrier 700 is composed of an organic or inorganic material.

A common electrode 770 is disposed on the OLED 200 and the barrier to complete the display. Exemplary embodiments of the common electrode 770 may be formed from the same material as the pixel electrode 600, the data conductors 545a and 545b or the gate electrodes.

As described above, the organic light emitting unit has layers of a red, blue and green light emitting material, each having a different surface area. The OLED emits high purity white light so that when passed through the color filters of each individual pixel of a plurality of pixels the OLED display can realize full color.

While the present invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. A method of manufacturing an organic light emitting diode display, comprising:
   providing a substrate including a gate electrode, a data electrode, a power source electrode and a color filter;
   forming a first electrode on the substrate;
   applying a photoresist on the substrate;
   forming a protrusion around an emission region by exposing and developing the photoresist to expose at least a part of the photoresist around the emission region;
   forming a first emission layer by applying a first light emitting material at a first angle to a substrate surface;
   forming a second emission layer on the first emission layer by applying a second light emitting material at a second angle to the substrate surface, wherein the second angle differs from the first angle; and
   forming a second electrode on the first and second emission layers, wherein the first emission layer and the second emission layer overlapping each other in the emission region have different areas from each other.

2. The method of claim 1, further comprising:
   forming a third emission layer by applying a third light emitting material on the second emission layer at a third angle sloped to the substrate surface and different from the first and second angles before forming the second electrode.

3. The method of claim 2, wherein the second angle is larger than the first angle, and wherein the third angle is larger than the second angle.

4. The method of claim 3, wherein the third angle is substantially perpendicular to the substrate surface.

5. The method of claim 2, wherein the second angle is smaller than the first angle, and wherein the third angle is smaller than the second angle.

6. The method of claim 5, wherein the first angle is substantially perpendicular to the substrate surface.

7. The method of claim 2, wherein the first, second and third emission layers have first, second and third thicknesses, respectively, and wherein a sum of the first, second and third thicknesses is equal to or less than a height of the protrusion.

8. The method of claim 2, wherein the first emission layer emits a blue light.

9. The method of claim 2, wherein the color filter is overlapped with the first, second and third emission layers.

10. A method of manufacturing an organic light emitting diode display, comprising:
    providing a gate electrode, a data electrode, a power source electrode and a color filter on a substrate;
    forming a first electrode on the substrate;
    forming a protrusion around an emission region;
    forming a first emission layer by applying a first light emitting material at a first angle to the substrate surface;
    forming a second emission layer on the first emission layer by applying a second light emitting material at a second angle to the surface of the substrate, wherein the second angle differs from the first angle; and
    forming a second electrode on the first and second emission layers, wherein the first emission layer and the second emission layer overlapping each other in the emission region have different areas from each other.

11. The method of claim 1, wherein a light emitting efficiency of the first emission layer is greater than a light emitting efficiency of the second emission layer.

12. The method of claim 10, wherein a light emitting efficiency of the first emission layer is greater than a light emitting efficiency of the second emission layer.

* * * * *